United States Patent
Yamahara et al.

(10) Patent No.: US 8,582,376 B2
(45) Date of Patent: Nov. 12, 2013

(54) TIMING ADJUSTMENT CIRCUIT FOR A MEMORY INTERFACE AND METHOD OF ADJUSTING TIMING FOR MEMORY INTERFACE

(75) Inventors: Yosuke Yamahara, Tokyo (JP); Satoshi Ota, Kanagawa-ken (JP); Shigehiro Tsuchiya, Tokyo (JP); Hideaki Kito, Kanagawa-ken (JP); Hiroaki Iijima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 235 days.

(21) Appl. No.: 13/236,007

(22) Filed: Sep. 19, 2011

(65) Prior Publication Data
US 2012/0188833 A1    Jul. 26, 2012

(30) Foreign Application Priority Data

Jan. 21, 2011 (JP) .................................. P2011-10968

(51) Int. Cl.
*G11C 7/00* (2006.01)
(52) U.S. Cl.
USPC .......................................... 365/193; 365/194
(58) Field of Classification Search
USPC .......................................... 365/193, 194, 198
See application file for complete search history.

(56) References Cited

U.S. PATENT DOCUMENTS

| | | | |
|---|---|---|---|
| 6,940,760 B2 | 9/2005 | Borkenhagen et al. | |
| 2002/0149967 A1 | 10/2002 | Borkenhagen et al. | |
| 2004/0071015 A1 | 4/2004 | Borkenhagen et al. | |
| 2009/0091987 A1* | 4/2009 | Butt et al. | 365/189.05 |
| 2011/0182216 A1* | 7/2011 | Ono et al. | 370/282 |

FOREIGN PATENT DOCUMENTS

JP    2007265399    10/2007

* cited by examiner

*Primary Examiner* — Vu Le
(74) *Attorney, Agent, or Firm* — White & Case LLP (57) ABSTRACT

According to one embodiment, a timing adjustment circuit for a memory interface is presented. The circuit is provided with a gate circuit, an original gate signal generation circuit, a high impedance prevention unit, an impedance control unit and a gate leveling circuit. The gate circuit performs gating of a data strobe signal outputted from a memory. The original gate signal generation circuit generates an original gate signal based on information of a read latency and a burst length. The high impedance prevention unit to prevent the data strobe signal from being in a high impedance state. The impedance control unit controls execution and release of operation of the high impedance prevention unit. The gate leveling circuit outputs a timing adjusted gate signal to the gate circuit based on the original gate signal and the data strobe signal.

16 Claims, 11 Drawing Sheets

TIMING ADJUSTMENT CIRCUIT FOR A MEMORY INTERFACE AND METHOD OF ADJUSTING TIMING FOR MEMORY INTERFACE

CROSS-REFERENCE TO RELATED APPLICATION(S)

This application is based upon and claims the benefit of priority from the prior Japanese Patent Application No. 2011-10968, filed on Jan. 21, 2011, the entire contents of which are incorporated herein by reference.

FIELD

Embodiments described herein relate generally to a timing adjustment circuit for a memory interface and to a method of adjusting timing for a memory interface.

BACKGROUND

A double data rate synchronous dynamic random access memory (DDR-SDRAM) is known. The DDR-SDRAM is connected to a semiconductor device provided with a dedicated interface circuit. Data is communicated between the DDR-SDRAM and the interface circuit.

When a read operation is performed in the DDR-SDRAM, a data strobe signal and a data signal synchronized with an edge of the data strobe signal DQS are outputted from the DDR-SDRAM to the interface circuit through a plurality of transmission lines. The interface circuit connected to the DDR-SDRAM detects the edge of the data strobe signal in order to receive the data signal.

When a write operation is performed in the DDR-SDRAM, the data strobe signal is outputted from the interface circuit to the DDR-SDRAM. As described above, since the data strobe signal is a bi-directional signal, a transmission line of the data strobe signal enters into a high impedance state when the read and write operations are not performed.

When a read command is issued, the data strobe signal is changed from the high impedance state to a data strobe output state after a preamble period. When the transmission line of the data strobe signal enters into the high impedance state, pulse-shaped noise may easily occur in the data strobe signal due to the influence of crosstalk etc. When such noise occurs before an original data strobe is outputted, the interface circuit may receive a data signal incorrectly.

Conventionally, in order to prevent receiving a data signal incorrectly, the interface circuit is provided with a gate signal for setting an available period of the data strobe signal according to a latency of the DDR-SDRAM. The interface circuit receives the data signal using a data strobe signal gated by the gate signal.

However, due to variations of an operation voltage and a temperature of the DDR-SDRAM, the phases of the data strobe signal and the gate signal may change, or the transfer time of the data strobe signal which is transmitted through a transmission path may vary. In a conventional system, variation of a phase relation may occur between the data strobe signal and the gate signal due to such change or variation.

In such a case, when the above mentioned noise is included in a gated data strobe signal or a primary data strobe is not outputted, a data signal may be received incorrectly. Especially, in high speed transmission beyond 1 Gbps, the phase change amount becomes so large that it can not be ignored.

DETAILED DESCRIPTION

According to one embodiment, a timing adjustment circuit for a memory interface is presented. The timing adjustment circuit is provided with a gate circuit, an original gate signal generation circuit, a high impedance prevention unit, an impedance control unit and a gate leveling circuit.

The gate circuit performs gating of a data strobe signal outputted from a memory. The original gate signal generation circuit generates an original gate signal based on information of a read latency and a burst length. The high impedance prevention unit to prevent the data strobe signal from being in a high impedance state. The impedance control unit controls execution and release of operation of the high impedance prevention unit. The gate leveling circuit outputs a timing adjusted gate signal to the gate circuit based on the original gate signal and the data strobe signal.

Hereinafter, further embodiments will be described with reference to the drawings.

In the drawings, the same reference numerals denote the same or similar portions respectively.

A first embodiment will be described with reference to FIG. 1.

Figure 1:
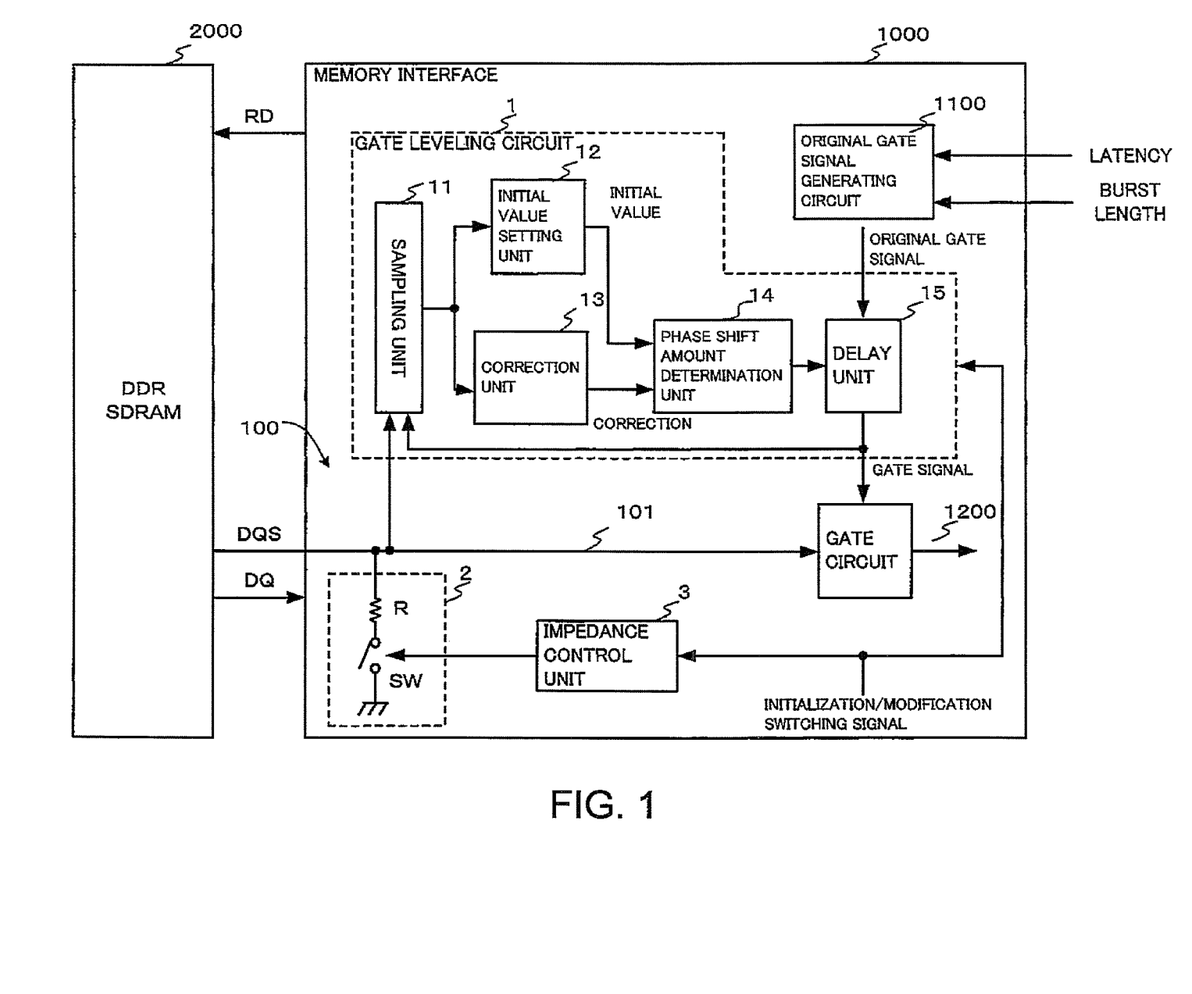
FIG. 1 is a block diagram illustrating a memory interface provided with a timing adjustment circuit according to an embodiment.

FIG. 1 is a block diagram illustrating an example of a memory interface provided with a timing adjustment circuit according to the embodiment.

The memory interface according to the embodiment performs processing of optimizing an output timing of a gate signal which gates a data strobe signal DQS outputted from a DDR-SDRAM, with respect to an output timing of the data strobe signal DQS. Hereinafter, the optimization processing will be referred to as "gate leveling".

A memory interface 1000 illustrated in FIG. 1 has a function of receiving data outputted from a DDR-SDRAM 2000. When a read command RD is transmitted from the memory interface 1000 to the DDR-SDRAM 2000, a data signal DQ and a data strobe signal DQS are outputted from the DDR-SDRAM 2000 to the memory interface 1000. The memory interface 1000 performs gate leveling for the outputted data strobe signal DQS. To this end, the memory interface 1000 is provided with an original gate signal generation circuit 1100 and a gate circuit 1200.

The original gate signal generation circuit 1100 determines the number of cycles ranging from issue of a read command RD to start of gating, based on information regarding a latency defined in the specification of the DDR-SDRAM 2000. Further, the original gate signal generation circuit 1100 determines a period of gating based on designation of a burst length for reading the memory, and generates an original gate signal. The burst length indicates the number of address spaces occupied by burst addresses among all address spaces of a memory. For example, when the number of all addresses of the memory is six (6), the number of the address spaces is 64. When the number of burst addresses is two (2), the burst address space is four (4) and the burst length is four (4). The burst address is a start address for accessing the memory, and subsequent addresses are automatically generated.

The gate circuit 1200 gates the data strobe signal DQS using a gate signal after gate leveling is performed for the original gate signal.

A timing adjustment circuit 100 of the embodiment which is provided in the memory interface 1000 as described above has a gate leveling circuit 1, a pull-down circuit 2, and an impedance control unit 3.

The gate leveling circuit 1 performs gate leveling of an original gate signal outputted from the original gate signal generation circuit 1100. The pull-down circuit 2 has a function of pulling down a transmission line 101 in order to prevent the transmission line 101 of the data strobe signal DQS from entering into a high impedance state. Through the transmission line 101, the data strobe signal DQS is transmitted. The impedance control unit 3 controls the execution/release of the pull-down operation of the pull-down circuit 2.

The gate leveling circuit 1 performs processing of shifting the phase of the original gate signal to an optimal position with respect to the output timing of the data strobe signal DQS.

The gate leveling circuit 1 is provided with a sampling unit 11, an initial value setting unit 12, a correction unit 13, a phase shift amount determination unit 14, and a delay unit 15.

The sampling unit 11 samples the data strobe signal DQS by a predetermined number of times using a sampling clock signal with a phase controlled by a gate signal. The initial value setting unit 12 detects an initial edge of the data strobe signal DQS from the sampled data of the data strobe signal DQS which is inputted when the impedance control unit 3 operates the pull-down circuit 2. further, the initial value setting unit 12 sets the initial value of a phase shift amount of the original gate signal according to the detected phase.

The correction unit 13 determines a correction direction of the phase shift amount of the original gate signal from the sampled data of the data strobe signal DQS which is inputted when the impedance control unit 3 does not operate the pull-down circuit 2. The phase shift amount determination unit 14 determines the phase shift amount of the original gate signal based on the output of the initial value setting unit 12 or the correction unit 13. The delay unit 15 delays the original gate signal according to the phase shift amount designated by the phase shift amount determination unit 14, and outputs a gate signal to the gate circuit 1200.

An initialization/correction switching signal is inputted to the gate leveling circuit 1 and the impedance control unit 3. The initialization/correction switching signal switches whether to operate the initial value setting unit 12 or the correction unit 13.

The pull-down circuit 2 is provided with a pull-down resistor R connected to a ground terminal, and a switch SW inserted between the pull-down resistor R and the signal line of the data strobe signal DQS. The switch SW is turned on when the execution of a pull-down operation is instructed by the impedance control unit 3. By the instruction, the signal line of the data strobe signal DQS is pulled down in the ground potential direction. Furthermore, the switch SW is turned off when the release of the pull-down operation is instructed by the impedance control unit 3.

The impedance control unit 3 instructs the pull-down circuit 2 to perform the execution of the pull-down operation when the initialization/correction switching signal indicates "initialization", and to perform the release of the pull-down operation when the initialization/correction switching signal indicates "correction".

Figure 2:
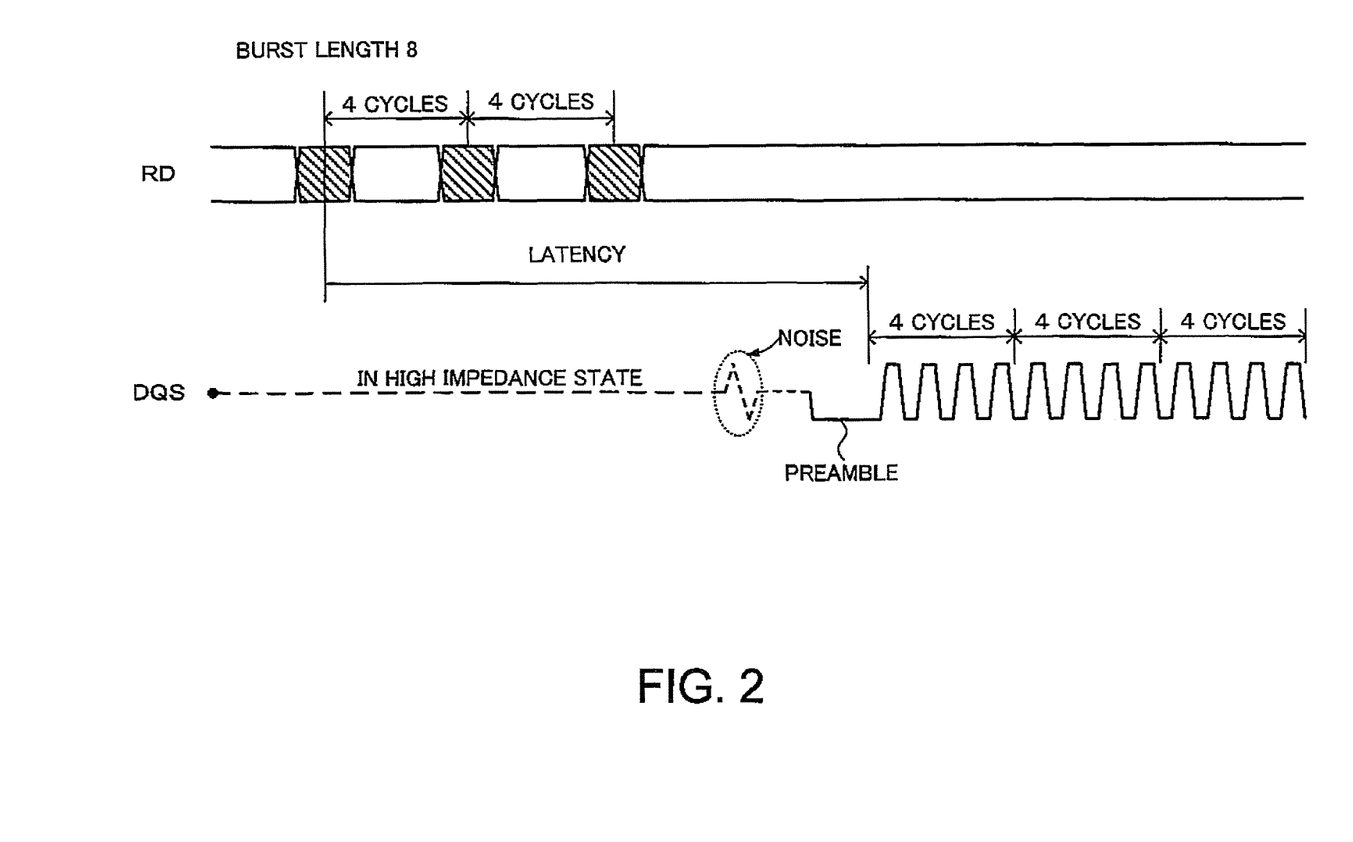
FIG. 2 is a diagram illustrating an example of a data strobe signal outputted from a DDR-SDRAM.

FIG. 2 illustrates the relation between the read command RD and the data strobe signal DQS. FIG. 2 shows an example where a burst length is 8 and the read command RD is continuously issued three times. When the burst length is 8, the read command RD is issued every four cycles.

When the read command RD is issued, the data strobe signal DQS becomes a signal whose level changes periodically, via a preamble from the high impedance state. The latency i.e. the read latency defined in the specification of the DDR-SDRAM 2000 is required during the period from the issue of the read command RD to the output of the data strobe signal DQS. The data strobe signal DQS is originally a differential signal which has a pair of a non-inverted signal and an inverted signal. FIG. 2 illustrates only one of the non-inverted signal and the inverted signal. When the transmission line 101 is in a high impedance state, noise may occur in the data strobe signal DQS due to crosstalk etc.

In order to avoid causing an erroneous operation of the initial value setting unit 12 due to the noise, the pull-down circuit 2 is provided in the embodiment of FIG. 1. The operation of the pull-down circuit 2 makes it possible to prevent the transmission line 101 of the data strobe signal DQS from entering into a high impedance state, and prevents occurrence of noise in the data strobe signal DQS. Instead of the pull-down circuit 2, a pull-up circuit may be provided.

Figure 3:
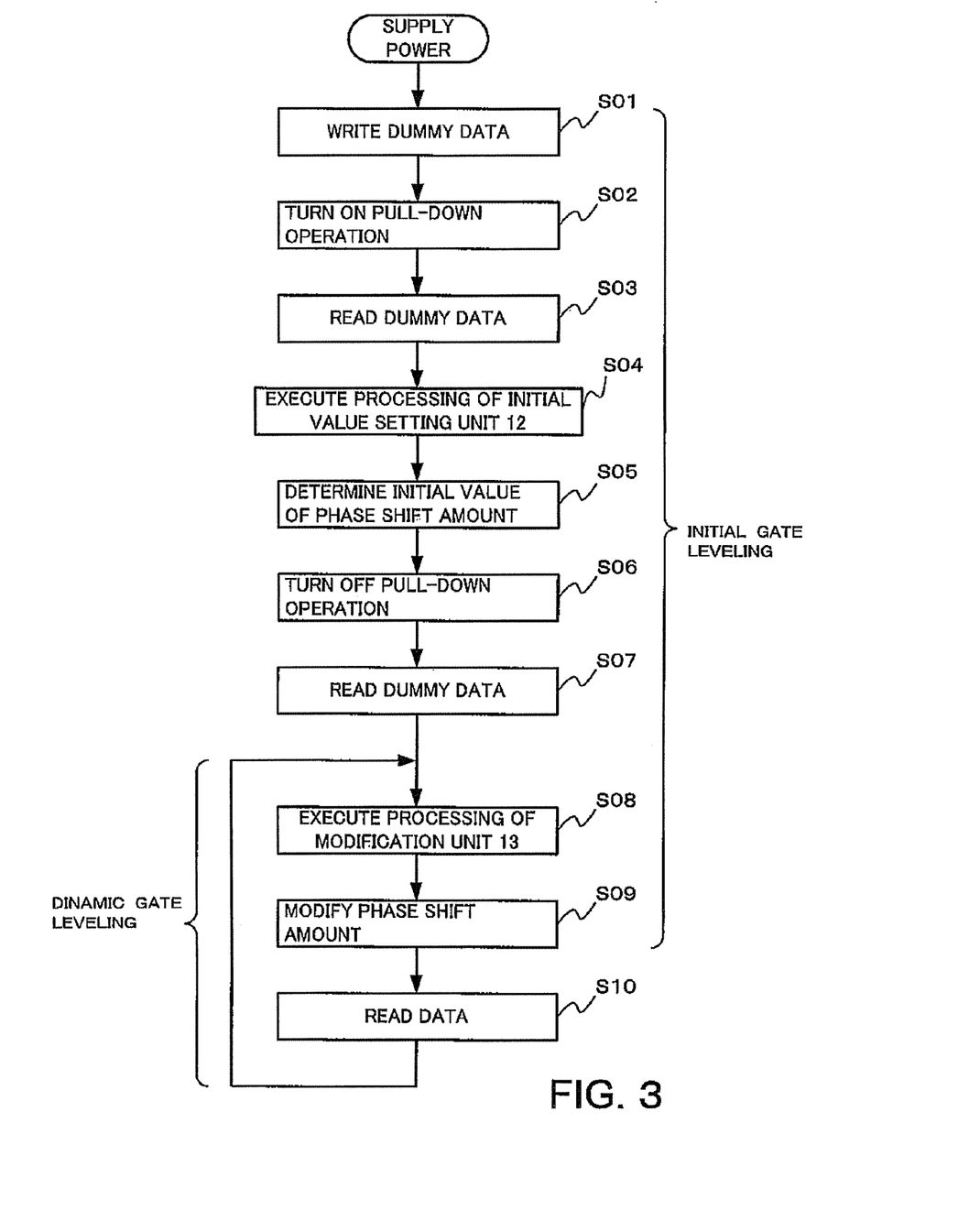
FIG. 3 is a flowchart illustrating an example of phase shift amount adjustment processing of a gate signal using the timing adjustment circuit according to the embodiment.

FIG. 3 is a flowchart illustrating an example of phase shift adjustment processing of an original gate signal using the timing adjustment circuit 100 of the embodiment.

After start of supplying power, when the initialization of the memory interface 1000 and the DDR-SDRAM 2000 is completed, dummy data is written in the DDR-SDRAM 2000 (step S01). The dummy data is data showing that all bits are set to '0' or '1'. The dummy data may exclude crosstalk from the data signal DQ which is received when the data strobe signal DQS is received.

The initialization/correction switching signal is set to "initialization" to allow the switch SW of the pull-down circuit 2 to be turned on, so that the signal line of the data strobe signal DQS is pulled down (step S02).

Then, the read command RD is issued and a read operation of the dummy data is performed (step S03).

At this time, the initial value setting unit 12 detects the initial edge of the data strobe signal DQS which is outputted from the DDR-SDRAM 2000 (step S04). The initial value setting unit 12 sets the initial value of the phase shift amount of the original gate signal according to the phase of the initially detected edge of the data strobe signal DQS (step S05).

The phase shift amount determination unit 14 determines the phase shift amount of the original gate signal based on the setting of the initial value setting unit 12.

At this time, waveform distortion such as smoother rising and steeper falling with respect to normal rising and falling occurs in the inputted data strobe signal DQS due to the influence of the pulling down. In this regards, it is necessary to remove an error due to the waveform distortion.

Accordingly, the initialization/correction switching signal is switched to "correction" to allow the switch SW of the pull-down circuit 2 to be turned off. As a result, the pulling down of the signal line of the data strobe signal DQS is released (step S06).

Then, the read command RD is issued and a read operation of the dummy data is performed (step S07). At this time, the data strobe signal DQS outputted from the DDR-SDRAM 2000 has a normal waveform which is not affected by the influence of the pulling down.

The processing of the correction unit 13 is performed for the data strobe signal DQS (step S08). The correction unit 13 determines a correction direction such as increase, reduction, or maintaining of the phase shift amount with respect to the initial value. The phase shift amount determination unit 14 determines a correction amount based on the determination of the correction unit 13 (step S09).

Through the correction, an error of the phase shift amount due to the influence of the pulling down is removed. The value of the phase shift amount which is corrected according to the correction direction determined by the correction unit 13 becomes a new initial value of the phase shift amount. The series of processing up to step S09 will be referred to as "initial gate leveling" hereinafter.

Then, the DDR-SDRAM 2000 starts a normal operation. However, due to variation of an operation voltage or a peripheral temperature of the DDR-SDRAM 2000, the delay time of an outputted data strobe signal DQS may be changed, and the phase relation between the data strobe signal DQS and the gate signal may be deviated. In this regards, in the embodiment, the correction unit 13 corrects the phase shift amount whenever normal reading of data from the DDR-SDRAM 2000 is performed. The correction processing will be referred to as "dynamic gate leveling" hereinafter.

In the flow of the dynamic gate leveling, normal reading of data from the DDR-SDRAM 2000 is performed (step S10). The processing performed by the correction unit 13 in step S08 and the correction of the phase shift amount of step S09 are repeated whenever the reading of data is performed.

The delay time which is determined by the delay unit 15 based on the phase shift amount corrected by the dynamic gate leveling is updated at a timing. The timing is set at a time when any read command is not issued, during execution of refresh of the DDR-SDRAM 2000, for example.

By the dynamic gate leveling, the output phase of the gate signal can follow the variation of delay time of the data strobe signal DQS due to variation of the operation voltage or the temperature of the DDR-SDRAM 2000, dynamically.

Figure 4:
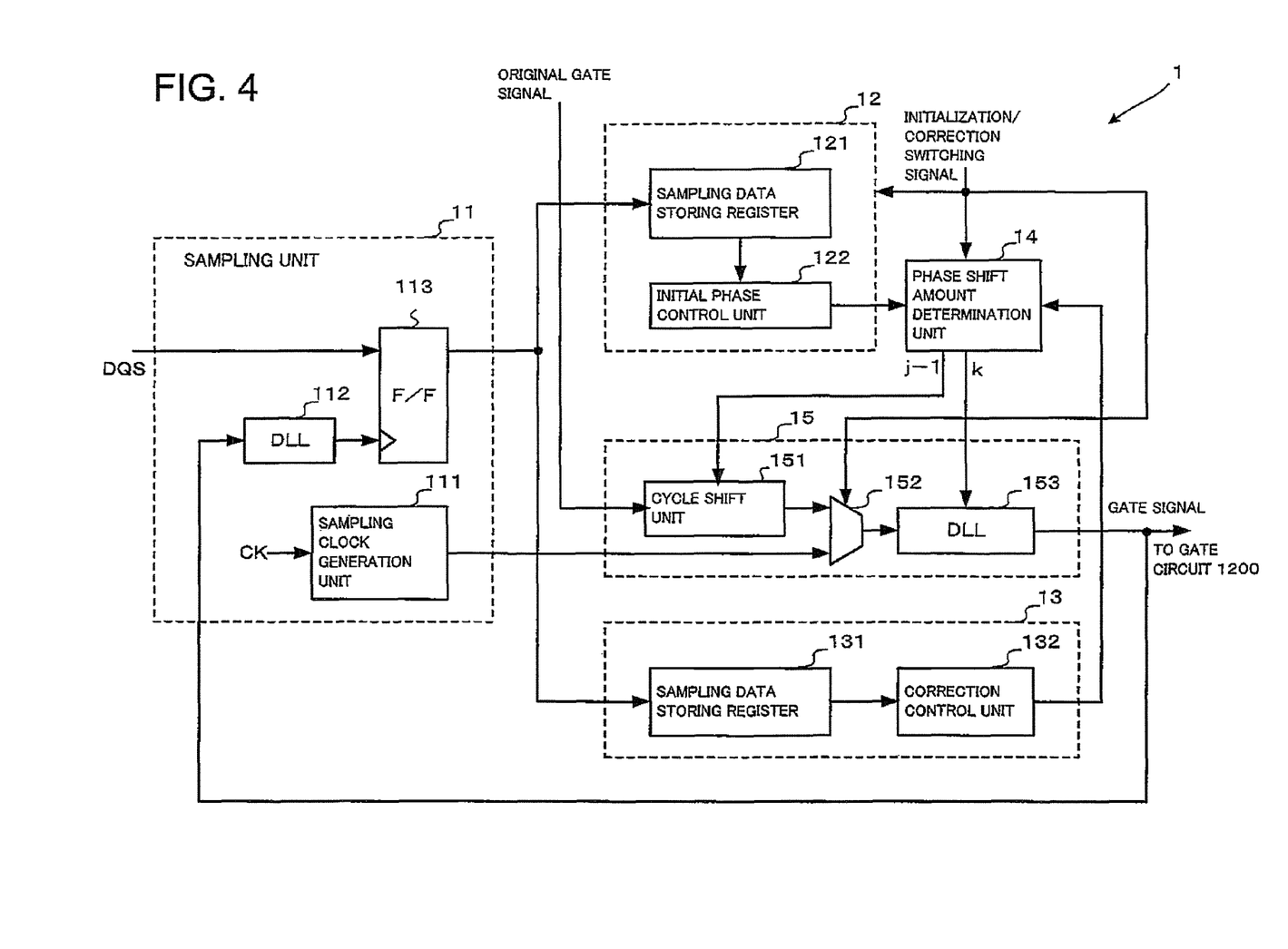
FIG. 4 is a block diagram illustrating a detailed example of a gate leveling circuit according to the embodiment.

FIG. 4 is a block diagram illustrating a detailed example of the gate leveling circuit 1.

The sampling unit 11 is provided with a sampling clock signal generation unit 111, a sampling start timing control unit (DLL) 112, and a sampling circuit 113.

The sampling clock signal generation unit 111 generates a sampling clock signal based on a system clock signal CK. The sampling start timing control unit 112 adjusts the time period from start of gating by the gate signal which is outputted from the delay unit 15 to start of outputting the sampling clock signal, in order to be set to a predetermined value. The sampling circuit 113 is a flip-flop which latches the data strobe signal DQS using the sampling clock signal outputted from the sampling start timing control unit 112.

The output of the sampling clock signal generation unit 111 is inputted to the delay unit 15 when the initialization/correction switching signal of FIG. 1 indicates "initialization". The delay unit 15 performs a phase shift, and the phase shifted signal is inputted to the sampling start timing control unit 112. The phase shift operation will be described in detail below.

The initial value setting unit 12 is provided with a first sampling data storage resister 121 and an initial phase control unit 122.

The first sampling data storage resister 121 stores sampling data which is obtained through sampling processing performed a plurality of times by the sampling circuit 113, while shifting the phase of the sampling clock signal sequentially. The first sampling data storage resister 121 stores the sampling data in a sampling order.

The initial phase control unit 122 controls the sequential shift of the phase of the sampling clock signal when the sampling processing is performed a plurality of times by the sampling circuit 113. After the plurality of times of the sampling processing is completed, the initial phase control unit 122 searches the data stored in the first sampling data storage resister 121. The initial phase control unit 122 determines a phase shift amount, based on a sampling order corresponding to a register from which a level i.e. '1' opposite to a pull-down level i.e. '0' is detected initially.

When the data strobe signal DQS is pulled up instead of being pulled down, the initial phase control unit 122 determines a phase shift amount based on a sampling order corresponding to a register from which a level i.e. '0' opposite to a pull-up level i.e. '1' is detected initially.

The initial value setting unit 12 operates when the initialization/correction switching signal indicates "initialization".

The correction unit 13 is provided with a second sampling data storage resister 131 and a correction control unit 132. The second sampling data storage resister 131 stores the sampled data which is obtained through the sampling processing performed a plurality of times by the sampling circuit 113, using a sampling clock signal with a fixed phase. The correction control unit 132 corrects the delay amount of the delay unit 15 based on the relation among the values of the sampled data which are stored in the second sampling data storage resister 131.

When the initialization/correction switching signal indicates "initialization", the phase shift amount determination unit 14 determines the phase shift amount of the sampling clock signal whose corresponding clock signal is provided to the sampling circuit 113, and the phase shift amount of the original gate signal, based on the output of the initial value setting unit 12. When the initialization/correction switching signal indicates "correction", the phase shift amount determination unit 14 determines the correction amount of the phase shift amount of the original gate signal.

The delay unit 15 is provided with a cycle shift unit 151 as a first delay unit, a selector 152 and a delay circuit (represented as "DLL" in FIG. 4) 153 as a second delay unit. The cycle shift unit 151 delays the original gate signal in a unit of a cycle of the sampling clock signal. The selector 152 selects the output of the sampling clock signal generation unit 111 and the output of the cycle shift unit 151. The selector 152 selects the output of the sampling clock signal generation unit 111 when the initialization/correction switching signal indicates "initialization". The selector 152 selects the output of the cycle shift unit 151 when the initialization/correction switching signal indicates "correction". The delay circuit 153 delays the output of the selector 152 in a unit obtained by dividing the cycle of the sampling clock signal.

Based on the switching of the selector 152, the delay circuit 153 performs an operation of delaying a clock signal corresponding to the sampling clock signal outputted from the selector 152 by a phase shift amount. The phase shift amount is set by the initial value setting unit 12 and determined by the phase shift amount determination unit 14, during the execution of sampling at the time of "initialization".

After completion of the sampling during the time period of the "initialization", and during the time period of "correction", the delay circuit 153 performs an operation of delaying the original gate signal.

As described above, the delay circuit 153 is used both for the phase shift operation of the sampling clock signal and for the phase shift operation of the original gate signal.

Then, the operation of the gate leveling circuit 1 illustrated in FIG. 4 will be described with reference to FIGS. 5 to 11.

Figure 5:
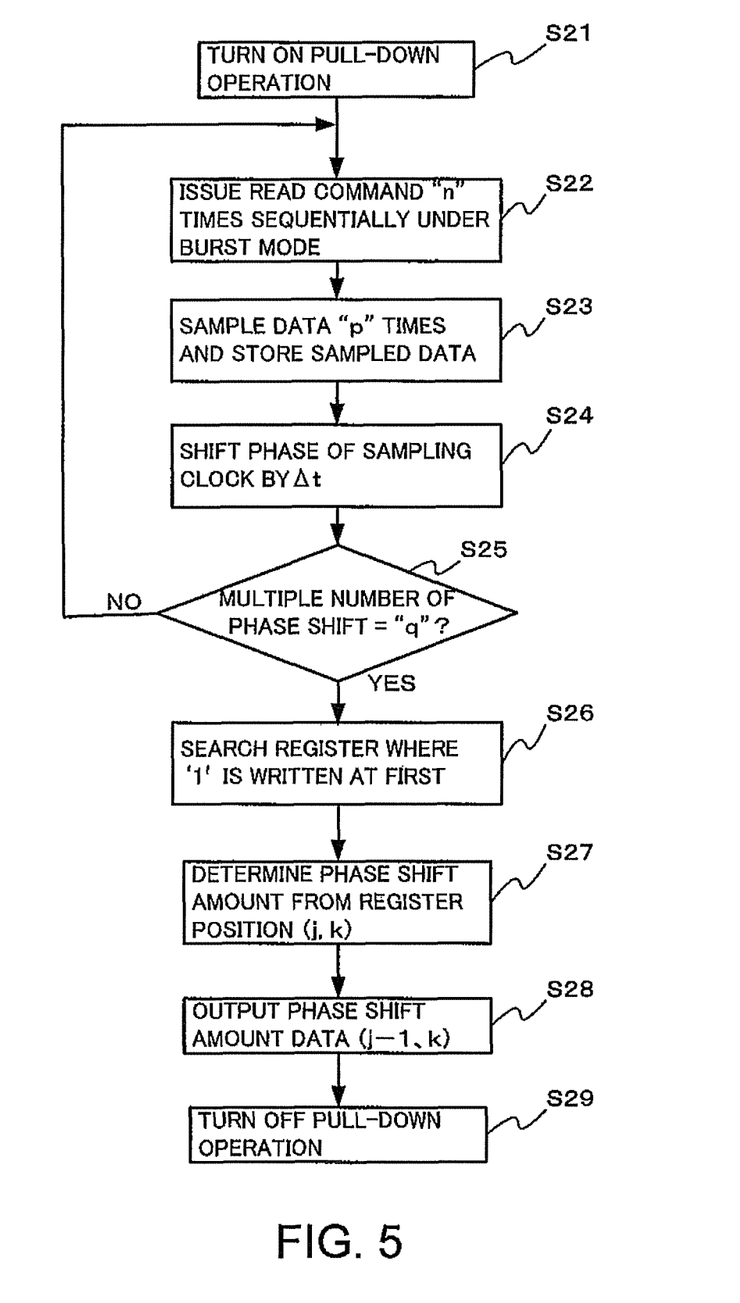
FIG. 5 is a flowchart illustrating an example of processing of an initial value setting unit provided in the gate leveling circuit according to the embodiment.

FIG. 5 is a flowchart illustrating an example of processing of the initial value setting unit 12.

When the processing of the initial value setting unit 12 is executed, the initialization/correction switching signal shown in FIG. 1 is set to "initialization". In addition, the switch SW of the pull-down circuit 2 is turned on by the impedance control unit 3 so that the signal line for transmitting the data strobe signal DQS is pulled down (step S21). The read command RD is continuously issued "n" times in a burst mode (step S22).

Figure 6:
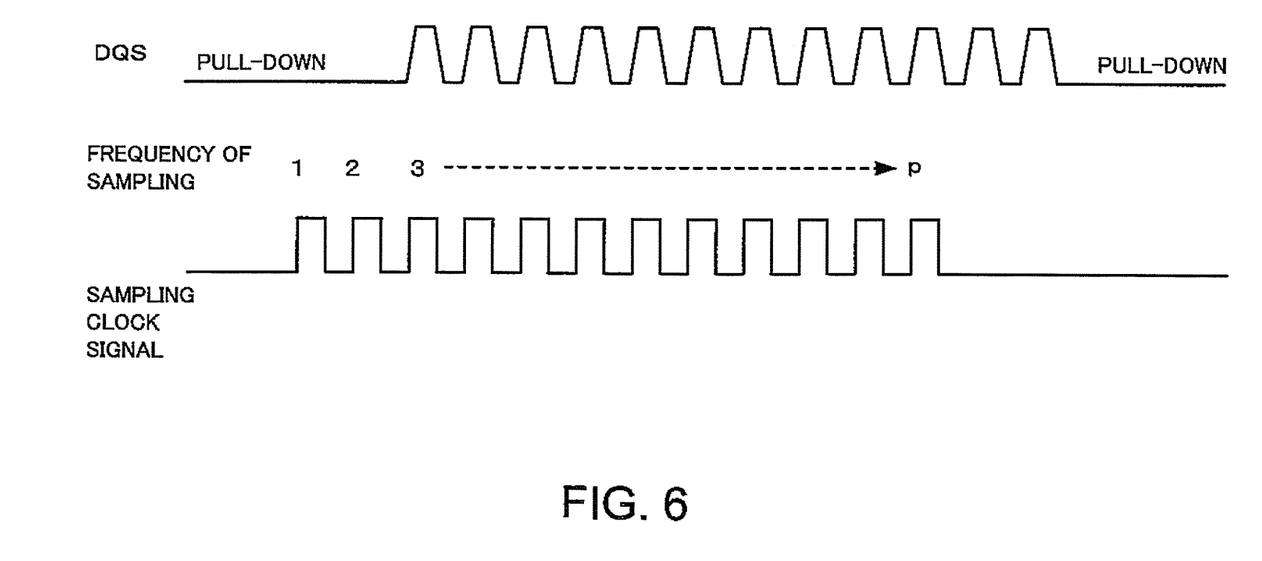
FIG. 6 is a diagram illustrating an example of a data strobe signal and a sampling clock signal produced during the time period when an initial value of the phase shift amount of the gate signal is set.

The read command RD is issued so that the data strobe signal DQS becomes a continuous signal which changes periodically and is pulled down during a period other than a signal output period as illustrated in FIG. 6.

The data strobe signal DQS is sampled "p" times using a clock signal corresponding to a sampling clock signal or a gate signal. The clock signal is obtained by providing the output of the sampling clock signal generation unit 111 to the delay circuit 153 via the selector 152 and by performing phase shift of the provided output by the delay circuit 153. The number of sampling times "p" is set to include a preamble period sufficiently. The sampled data obtained by performing the sampling "p" times is stored in the registers of the first sampling data storage resister 121, in a sampling order (step S23).

At this time, the initial phase control unit 122 sets the phase shift amount of the sampling clock signal to zero. Moreover, the sampling start timing control unit 112 normally performs an operation of adjusting the time period from start of gating of the gate signal outputted from the delay unit 15 to start of output of the sampling clock signal, in order to set to a predetermined value. However, in step S23, the sampling start timing control unit 112 delays the clock signal which is outputted from the delay unit 15, by a time period indicated by the predetermined value.

Figure 7:
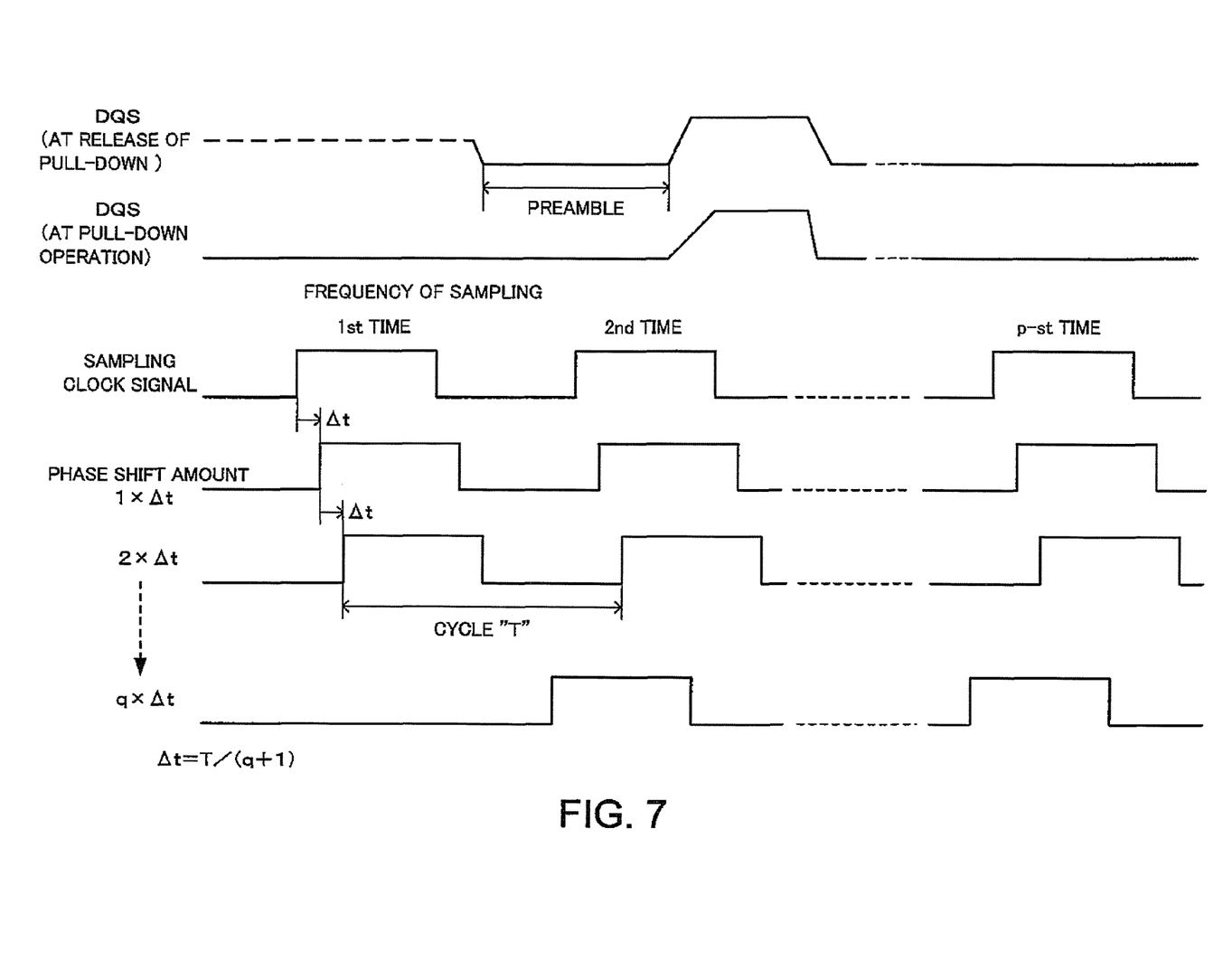
FIG. 7 is a diagram to explain a state of phase shift of the sampling clock signal.

FIG. 7 is a diagram to explain a state of phase shift of the sampling clock signal.

The initial phase control unit 122 shifts the phase of the sampling clock signal by Δt (step S24). The Δt denotes a unit amount of phase shift which is calculated by Δt=T/(q+1), assuming that the cycle of the sampling clock signal is expressed as "T" and that "q" is expressed as the number of phase shifts.

In the embodiment, the phase shift is performed "q" times while increasing the phase by Δt one after another. In other words, the phase shift amount is increased one after another by different multiples of Δt, such as 1×Δt, 2×Δt, ..., q×Δt, as illustrated in FIG. 7.

It is checked whether the increased value of the multiple of the phase shift reaches "q" (step S25). When the increased value of the multiple of the phase shift is smaller than "q", the processing of step S22 to step S25 are repeated.

When the increased value of the multiple of the phase shift reaches "q", the data stored in the first sampling data storage register 121 is searched and a register where '1' is stored initially is detected (step S26).

Figure 8:
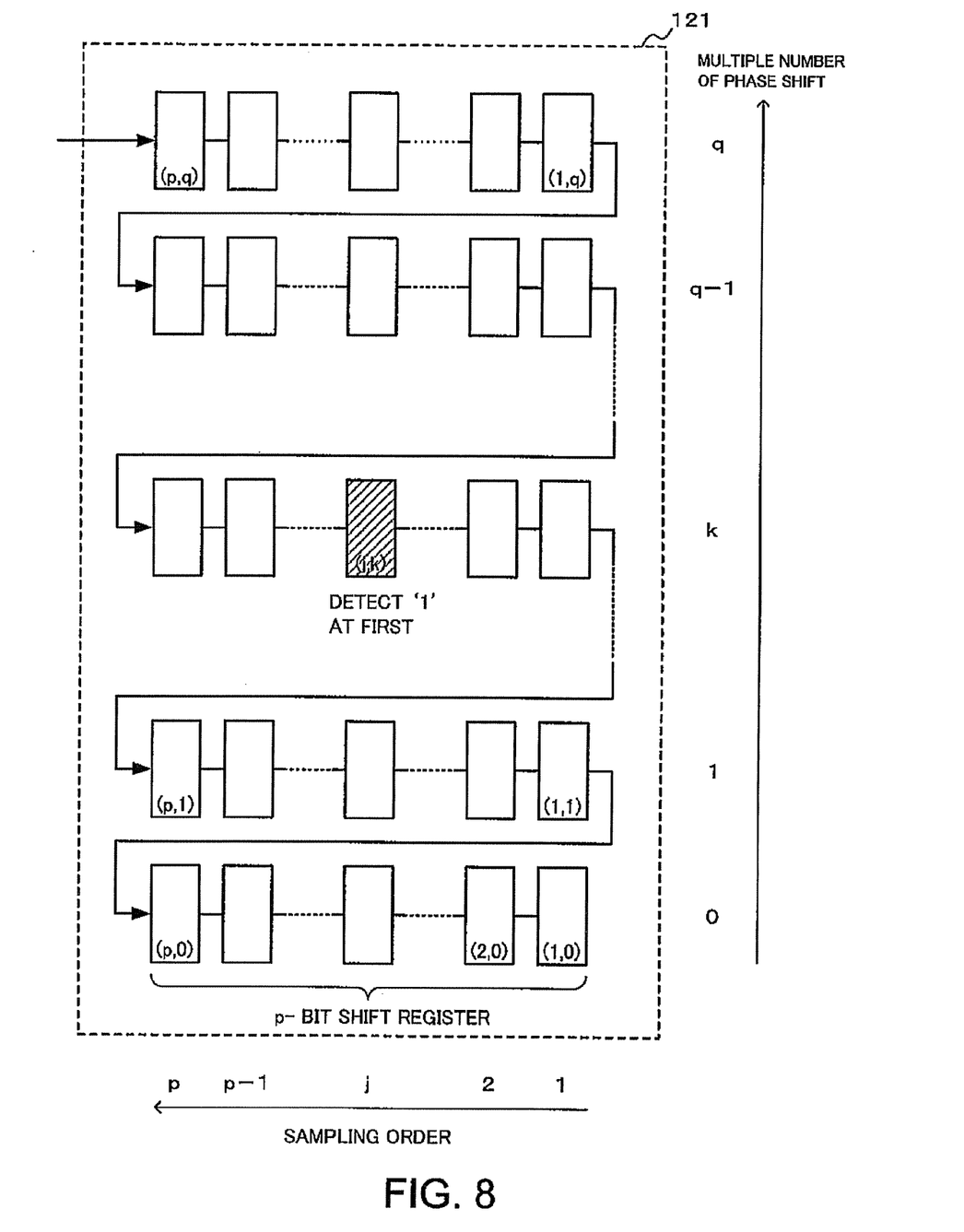
FIG. 8 is a block diagram illustrating an example of a sampling data storage register provided in the initial value setting unit of the gate leveling circuit according to the embodiment.

FIG. 8 illustrates an example of the first sampling data storage resister 121. In the embodiment, the first sampling data storage resister 121 is a shift register including p×(q+1) registers.

To each of the registers, an address based on each phase shift multiple and a sampling order are assigned. Specifically, the address is assigned in such a manner that an address (1, 0) is given as the initial address when the phase shift multiple is zero (0) and the sampling order is the first and that an address (p, q) is given as the final address when the phase shift multiple is "q" and the sampling order is the last, for example.

When an address of the register where '1' is initially stored is checked, the phase shift multiple and the sampling order can be immediately identified. For example, when the address of the register where '1' is initially stored is (j, k), it can be found that the phase shift multiple is "k" and the sampling order is "j".

Considering that the phase of a sampling clock signal is shifted and '1' of a data strobe signal DQS is acquired through a first sampling, it can be found sufficient to shift the start timing of an output of the sampling clock signal at the time point only by {(j−1)cycles+k×Δt}.

In the embodiment, the start timing of output of a sampling clock signal is linked to the start timing of gating of a gate signal by the sampling start timing control unit 112. The start timing of output of the sampling clock signal is delayed in proportion to the delay of the start timing of gating of the gate signal.

When a value of start timing of sampling set by the sampling start timing control unit 112 is smaller than that of the preamble period of the data strobe signal DQS, the start timing of gating of the gate signal can be within the preamble period surely.

Thus, a phase shift amount {(j−1)cycles+k×Δt} is determined based on the address (j, k) of the register where '1' is stored initially (step S27). The phase shift amount data (j−1, k) is outputted to the delay unit 15 (step S28).

In the delay unit 15, the cycle shift unit 151 delays the original gate signal by (j−1) cycles. The delay circuit 153 delays the output of the cycle shift unit 151 by k×Δt.

Then, the initialization/correction switching signal is set to "correction". The switch SW of the pull-down circuit 2 is turned off by the impedance control unit 3, and the pulling down of the signal line of the data strobe signal DQS is released (step S29).

Figure 9:
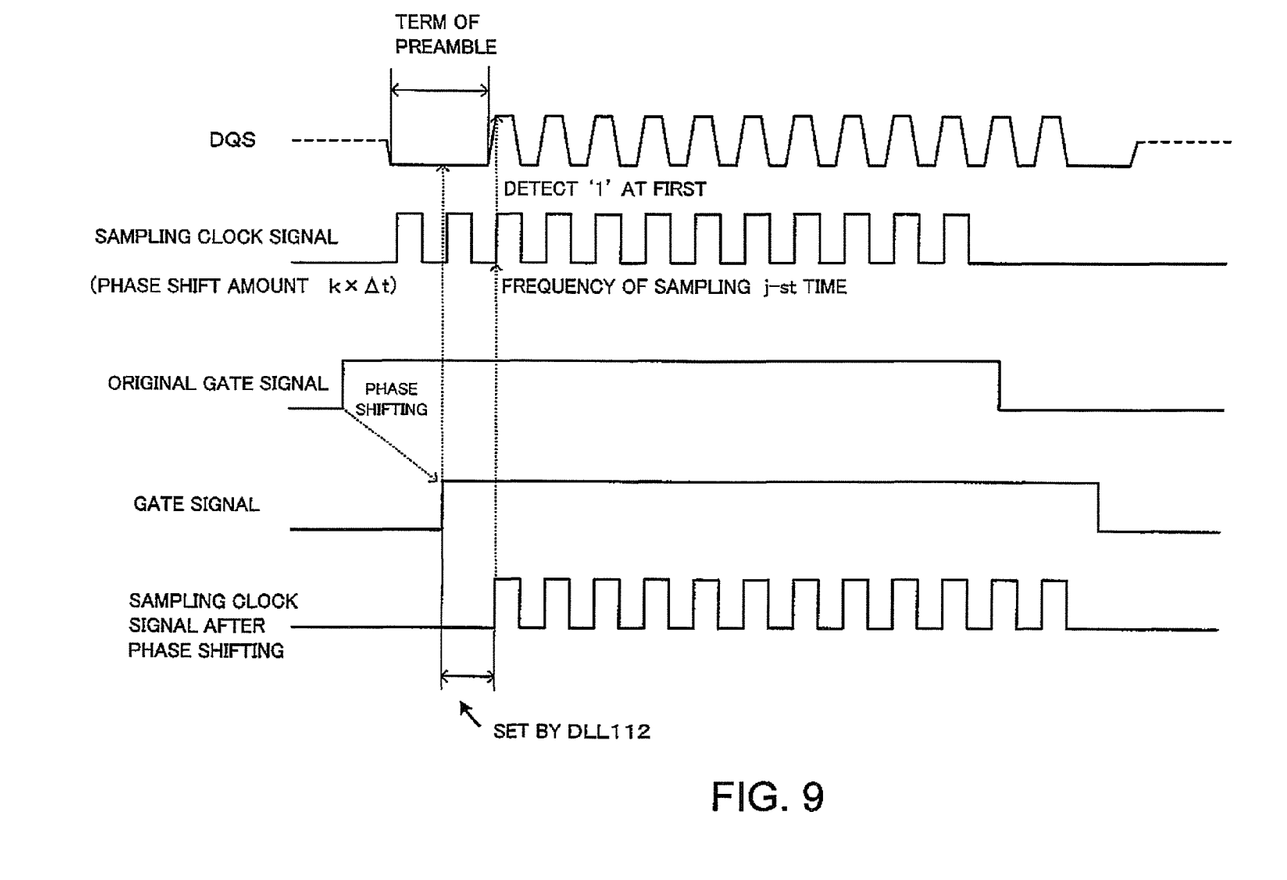
FIG. 9 is a diagram illustrating an example of setting the initial value of the phase shift amount of the gate signal using the gate leveling circuit according to the embodiment.

FIG. 9 illustrates a relation between the data strobe signal DQS and the gate signal after the initial gate leveling is completed.

When the gate signal is outputted by delaying the phase of the original gate signal by {(j−1)cycles+k×Δt}, the start timing of gating of the gate signal is within the preamble period of the data strobe signal DQS, since the address (j, k) of the register is an address where '1' is detected initially. Furthermore, as the phase of the gate signal is shifted, the phase of a sampling clock signal is also shifted.

A processing of the correction unit 13 will be described below.

Figure 10:
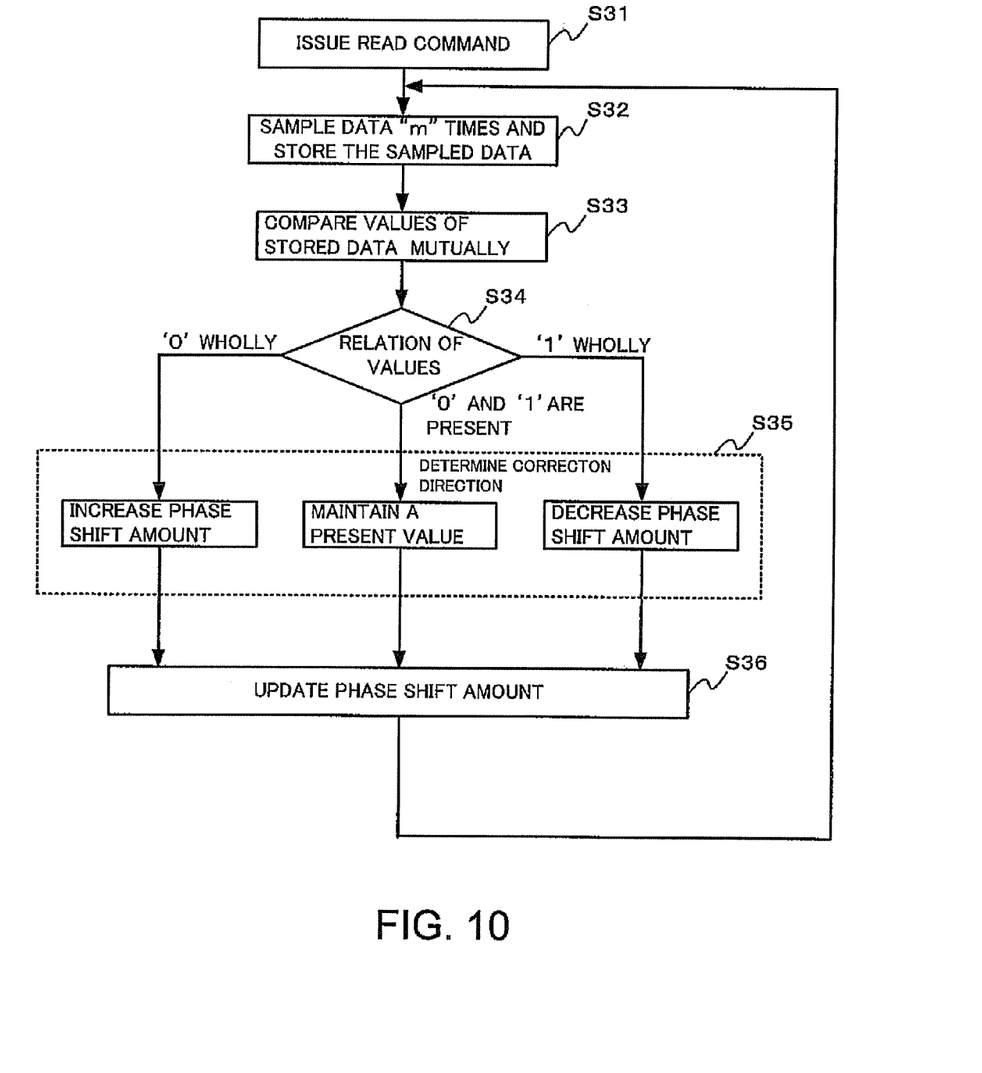
FIG. 10 is a flowchart illustrating an example of processing of a correction unit provided in the gate leveling circuit according to the embodiment.

FIG. 10 is a flowchart illustrating an example of a processing of the correction unit 13.

In FIG. 1, a read command RD is issued (step S31). After the read command RD is issued, the sampling unit 11 samples the data strobe signal DQS "m" times with the sampling clock signal having the shifted phase as illustrated in FIG. 9. The sampling unit 11 stores the sampling results in the registers of the second sampling data storage resister 131 of FIG. 4 (step S32).

The sampling clock signal at this time is the gate signal obtained by delaying the original gate signal, since the selector 152 of the delay unit 15 selects the output of the cycle shift unit 151.

When "m" times of the sampling operation are completed, the correction control unit 132 compares "m" values stored in the second sampling data storage resister 131 with one another (step S33), and checks whether the values are '0' wholly, '1' wholly, or a mixture of '0' and '1' (step S34).

The correction control unit 132 determines a correction direction such as increase, reduction, or maintaining of a phase shift amount with respect to a current value, based on the comparison result (step S35).

Figure 11A:
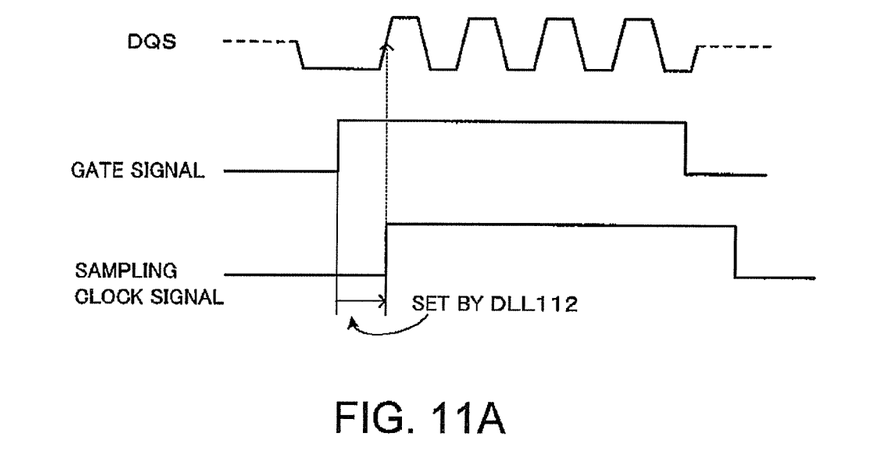
FIG. 11A to 11C are diagrams illustrating examples of a phase relation between the gate signal and the sampling clock signal, respectively, when the correction unit of the gate leveling circuit according to the embodiment performs processing.

At this time, in the embodiment, it is considered that the optimal output timing of the gate signal is a timing at which the edge of the sampling clock signal coincides with the edge of the data strobe signal DQS, as illustrated in FIG. 11A. In such a case, since the flip-flop of the sampling circuit 113 is in a metastable state, it is not fixed whether '0' or '1' is received in the sampling circuit 113. Thus, when the values of '0' and '1' are mixed in the data stored in the second sampling data storage resister 131, the correction control unit 132 determines that the output timing of the gate signal is optimal, and maintains a phase shift amount at that time point.

Figure 11B:
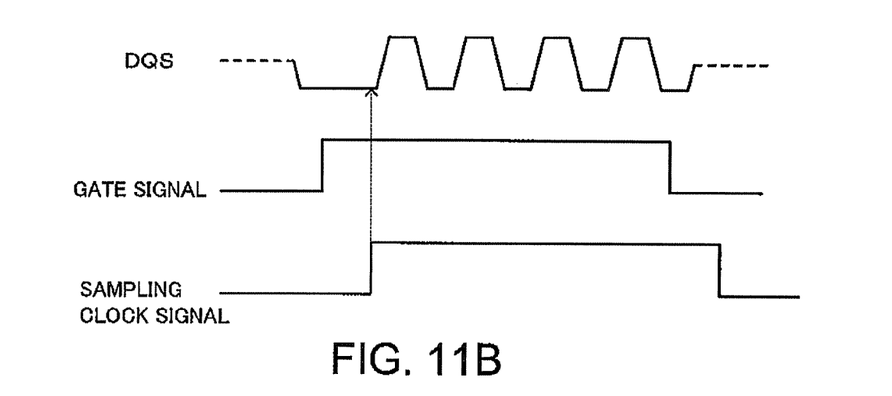

As illustrated in FIG. 11B, when the edge of the sampling clock signal exists prior to the edge of the data strobe signal DQS, '0' is received in the sampling circuit 113. When all the data stored in the second sampling data storage resister 131 has the value of '0', the correction control unit 132 determines that the output timing of the gate signal is early, and increases the phase shift amount.

Figure 11C:
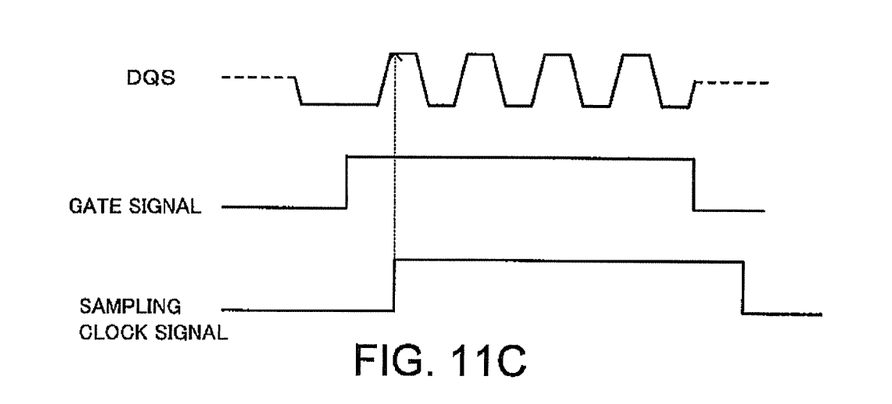

Furthermore, as illustrated in FIG. 11C, when the edge of the data strobe signal DQS exists prior to the edge of the sampling clock signal, '1' is received in the sampling circuit 113. When all the data stored in the second sampling data storage resister 131 has the value of '1', the correction control unit 132 determines that the output timing of the gate signal is late, and decreases the phase shift amount.

The phase shift amount determination unit 14 of FIG. 4 controls a delay time of the delay unit 15 based on the determination of the correction control unit 132, and updates the phase shift amount (step S36).

In this case, as described above, the delay circuit 153 delays the output of the selector 152 by the unit obtained by dividing a cycle of the sampling clock signal. The delay amount is represented by a shift angle with respect to a cycle of the data strobe signal DQS. The shift amount is increased or decreased by the shift angle, according to the correction control unit 132. Subsequently, the flow is returned to step S32 each time a new read command is issued, and sampling is performed using an increased or decreased phase shift amount the determination of the correction control unit 132.

Then, increase or decrease of the phase shift amount is determined by the correction control unit 132, and the phase shift amount is updated.

According to the embodiment as described above, the initial gate leveling is performed while preventing the transmission line 101 of the data strobe signal DQS from entering into a high impedance state. As a result, it is possible to set a gating start timing of a gate signal without being affected by the influence of noise which is caused by crosstalk etc. Moreover, the start timing of gating of the gate signal can be set within the preamble period of the data strobe signal DQS, so that it is possible to optimize a timing margin of the gate signal with respect to the data strobe signal DQS.

During the operation of the DDR-SDRAM, the dynamic gate leveling is performed, and the start timing of gating of the gate signal can be always corrected. As a result, even when a variation occurs in a delay time of the data strobe signal DQS due to variation etc. of an operation voltage or a peripheral temperature, it is possible to adjust the start timing of gating of the gate signal to an optimal timing following the variation.

According to the memory interface and the method of adjusting timing of a memory interface according to the embodiment as described above, it is possible to adjust the gating timing of an inputted data strobe signal according to a phase of the data strobe signal.

The above mentioned embodiment is applied to the gating of a data strobe signal of the DDR-SDRAM. In a similar manner, the embodiment can be applied to gating of data strobe signals of other memories which have a period when the data strobe signals enter into a high impedance state.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A timing adjustment circuit for a memory interface, comprising:
   a gate circuit to perform gating of a data strobe signal outputted from a memory;
   an original gate signal generation circuit to generate an original gate signal based on information of a read latency and a burst length;
   a high impedance prevention unit to prevent the data strobe signal from being in a high impedance state;
   an impedance control unit to control execution and release of operation of the high impedance prevention unit; and
   a gate leveling circuit to output a timing-adjusted gate signal to the gate circuit based on the original gate signal and the data strobe signal.

2. The circuit according to claim 1, wherein
   the impedance control unit executes operation of the high impedance prevention unit after start of power supplying, and the impedance control unit releases the operation of the high impedance prevention unit after passage of a predetermined time period.

3. The circuit according to claim 1, wherein the gate leveling circuit is provided with:
   a sampling unit to sample the data strobe signal by a predetermined number of times using a sampling clock signal with a controlled phase;

an initial value setting unit to detect an initial edge of the data strobe signal from sampling data of the data strobe signal inputted to the interface when the impedance control unit operates the high impedance prevention unit, the initial value setting unit setting an initial value of a phase shift amount of the original gate signal according to a phase detected by the detection;

a correction unit to determine a correction direction of the phase shift amount from the sampling data of the data strobe signal inputted to the interface when the impedance control unit does not operate the high impedance prevention unit;

a phase shift amount determination unit to determine the phase shift amount of the original gate signal based on an output of the initial value setting unit or the correction unit; and a delay unit to delay the original gate signal according to the phase shift amount determined by the phase shift amount determination unit, and to output a delayed gate signal to the gate circuit.

4. The circuit according to claim 3, wherein the sampling unit includes:
a sampling circuit to sample the data strobe signal;
a sampling clock signal generation unit to generate the sampling clock signal; and
a sampling start timing control unit which adjusts a period from gating start of the gate signal to outputting start of the sampling clock signal to the sampling unit so as to be set to a predetermined value.

5. The circuit according to claim 3, wherein the initial value setting unit includes:
a first sampling data storage resister provided with a plurality of registers which store sampling data in a sampling order, the sampling data being obtained by performing sampling a plurality of times through the sampling circuit while sequentially shifting the phase of the sampling clock signal; and
an initial phase control unit to control sequential shift of the phase of the sampling clock signal when the sampling is performed a plurality of times, and, after the plurality of times of the sampling is completed, to search the data stored in the first sampling data storage resister and to determine the phase shift amount from a sampling order corresponding to one of the registers from which a level is detected initially, the level being opposite to a level set in the high impedance prevention unit.

6. The circuit according to claim 5, wherein the correction unit comprises:
a second sampling data storage resister to store a result which is obtained by performing sampling a plurality of times through the sampling circuit, by using a sampling clock signal with a sampling phase fixed to a phase by the initial phase control unit, the phase corresponding to a sampling order detected when the gating start timing is determined; and
a correction control unit to determine a correction direction based on a mutual relationship among the values of data stored in the second sampling data storage resister, the correction direction indicating increase, reduction, or maintaining of the phase shift amount.

7. The circuit according to claim 3,
wherein the phase shift amount determination unit determines the phase shift amount of the sampling clock signal and the phase shift amount of the original gate signal based on the output of the initial value setting unit when the high impedance prevention unit operates, and determines the correction amount of the phase shift amount of the original gate signal when the high impedance prevention unit does not operate.

8. The circuit according to claim 3,
wherein the phase shift amount determination unit determines the phase shift amount of the sampling clock signal and the phase shift amount of the original gate signal based on the output of the initial value setting unit when the high impedance prevention unit operates, and determines the correction amount of the phase shift amount of the original gate signal when the high impedance prevention unit does not operate.

9. The circuit according to claim 4,
wherein the phase shift amount determination unit determines the phase shift amount of the sampling clock signal and the phase shift amount of the original gate signal based on the output of the initial value setting unit when the high impedance prevention unit operates, and determines the correction amount of the phase shift amount of the original gate signal when the high impedance prevention unit does not operate.

10. The circuit according to claim 5,
wherein the phase shift amount determination unit determines the phase shift amount of the sampling clock signal and the phase shift amount of the original gate signal based on the output of the initial value setting unit when the high impedance prevention unit operates, and determines the correction amount of the phase shift amount of the original gate signal when the high impedance prevention unit does not operate.

11. The circuit according to claim 6,
wherein the phase shift amount determination unit determines the phase shift amount of the sampling clock signal and the phase shift amount of the original gate signal based on the output of the initial value setting unit when the high impedance prevention unit operates, and determines the correction amount of the phase shift amount of the original gate signal when the high impedance prevention unit does not operate.

12. The circuit according to claim 7,
wherein the phase shift amount determination unit determines the phase shift amount of the sampling clock signal and the phase shift amount of the original gate signal based on the output of the initial value setting unit when the high impedance prevention unit operates, and determines the correction amount of the phase shift amount of the original gate signal when the high impedance prevention unit does not operate.

13. The circuit according to claim 3 wherein the delay unit includes:
a first delay unit to delay the original gate signal by a cycle unit of the sampling clock signal;
a selector to select output of the sampling clock signal generation unit when the high impedance prevention unit operates, and to select output of the first delay unit when the high impedance prevention unit does not operate; and
a second delay circuit to delay output of the selector by a unit obtained by dividing the cycle of the sampling clock signal.

14. The circuit according to claim 6,
wherein the correction control unit determines the correction direction according to whether the data stored in the second sampling data storage resister is '0' wholly, '1' wholly, or a mixture of '0' and '1', the correction direction indicating the increase, reduction, or maintaining of the phase shift amount.

15. The circuit according to claim 1,
wherein the memory includes a double data rate synchronous dynamic random access memory.

16. A method of adjusting timing for a memory interface, comprising:
generating an original gate signal based on information of a read latency and a burst length;
at a time of initialization after start of supplying power,
preventing a data strobe signal outputted from a memory, from being in a high impedance state,
sampling the data strobe signal outputted from the memory by transmission of a read command to the memory, and determining an initial value of a phase shift amount of the original gate signal,
releasing prevention of being in the high impedance state,
sampling the data strobe signal outputted from the memory by the transmission of the read command to the memory and correcting the phase shift amount, and
delaying the original gate signal according to the corrected phase shift amount; and
at a time of a normal operation of the memory,
releasing prevention of being in a high impedance state, and
sampling the data strobe signal outputted from the memory whenever the read command is transmitted to the memory, and correcting the phase shift amount,
wherein the gating of the data strobe signal is adjusted according to the correction of the phase shift amount.

* * * * *